US009069262B2

(12) United States Patent
Cortie et al.

(10) Patent No.: US 9,069,262 B2
(45) Date of Patent: Jun. 30, 2015

(54) FLUID HANDLING STRUCTURE INCLUDING GAS SUPPLY AND GAS RECOVERY OPENINGS, LITHOGRAPHIC APPARATUS AND DEVICE MANUFACTURING METHOD

(75) Inventors: Rogier Hendrikus Magdalena Cortie, Ittervoort (NL); Michel Riepen, Veldhoven (NL); Cornelius Maria Rops, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 374 days.

(21) Appl. No.: 13/542,546

(22) Filed: Jul. 5, 2012

(65) Prior Publication Data
US 2013/0016333 A1 Jan. 17, 2013

Related U.S. Application Data

(60) Provisional application No. 61/506,442, filed on Jul. 11, 2011, provisional application No. 61/526,992, filed on Aug. 24, 2011.

(51) Int. Cl.
*G03F 7/20* (2006.01)
(52) U.S. Cl.
CPC .................. *G03F 7/70341* (2013.01)
(58) Field of Classification Search
CPC .................................................. G03F 7/70341
USPC .......................................................... 355/30
See application file for complete search history.

(56) References Cited

U.S. PATENT DOCUMENTS

| 4,509,852 | A | 4/1985 | Tabarelli et al. |
|---|---|---|---|
| 6,952,253 | B2 | 10/2005 | Lof et al. |
| 7,081,943 | B2 | 7/2006 | Lof et al. |
| 7,372,541 | B2 | 5/2008 | Lof et al. |
| 7,388,648 | B2 | 6/2008 | Lof et al. |
| 8,144,305 | B2 | 3/2012 | Leenders et al. |
| 8,345,218 | B2 | 1/2013 | Riepen et al. |
| 8,547,523 | B2 | 10/2013 | Riepen et al. |
| 8,614,784 | B2 | 12/2013 | Riepen et al. |
| 2004/0160582 | A1 | 8/2004 | Lof et al. |
| 2004/0207824 | A1 | 10/2004 | Lof et al. |
| 2005/0264778 | A1 | 12/2005 | Lof et al. |
| 2005/0286033 | A1 | 12/2005 | Lin et al. |
| 2006/0038968 | A1 | 2/2006 | Kemper et al. |
| 2006/0158627 | A1 | 7/2006 | Kemper et al. |

(Continued)

FOREIGN PATENT DOCUMENTS

| CN | 101576718 | 11/2009 |
|---|---|---|
| CN | 100595678 | 3/2010 |

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A fluid handling structure for a lithographic apparatus, the fluid handling structure having, at a boundary from a space configured to contain immersion fluid to a region external to the fluid handling structure: a meniscus pinning feature to resist passage of immersion fluid in a radially outward direction from the space; a plurality of gas supply openings in a linear array at least partly surrounding and radially outward of the meniscus pinning feature; and a gas recovery opening radially outward of the plurality of gas supply openings in a linear array.

20 Claims, 7 Drawing Sheets

(56) References Cited

U.S. PATENT DOCUMENTS

| | | |
|---|---|---|
| 2007/0268466 A1 | 11/2007 | Leenders et al. |
| 2007/0296939 A1 | 12/2007 | Nishii |
| 2008/0186460 A1 | 8/2008 | Auer-Jongepier et al. |
| 2008/0212046 A1 | 9/2008 | Riepen et al. |
| 2008/0218726 A1* | 9/2008 | Lof et al. .................. 355/72 |
| 2008/0231822 A1 | 9/2008 | Poon et al. |
| 2009/0174871 A1 | 7/2009 | De Jong et al. |
| 2009/0279060 A1 | 11/2009 | Direcks et al. |
| 2009/0279062 A1 | 11/2009 | Direcks et al. |
| 2009/0279063 A1 | 11/2009 | Riepen et al. |
| 2010/0313974 A1 | 12/2010 | Riepen et al. |
| 2011/0013169 A1 | 1/2011 | Lafarre et al. |
| 2011/0090472 A1 | 4/2011 | Riepen et al. |
| 2011/0134401 A1 | 6/2011 | Rops et al. |
| 2011/0194084 A1 | 8/2011 | Riepen et al. |

FOREIGN PATENT DOCUMENTS

| | | |
|---|---|---|
| CN | 102023495 | 4/2011 |
| EP | 1 420 298 | 5/2004 |
| EP | 1 429 188 | 6/2004 |
| JP | 2007-142366 | 6/2007 |
| JP | 2008-147652 | 6/2008 |
| JP | 2009-188119 | 8/2009 |
| JP | 2009-272636 | 11/2009 |
| JP | 2010-278432 | 12/2010 |
| JP | 2011-071511 | 4/2011 |
| JP | 2011-097081 | 5/2011 |
| JP | 2012-028772 | 2/2012 |
| WO | 99/49504 | 9/1999 |
| WO | 2007/046523 | 4/2007 |

* cited by examiner

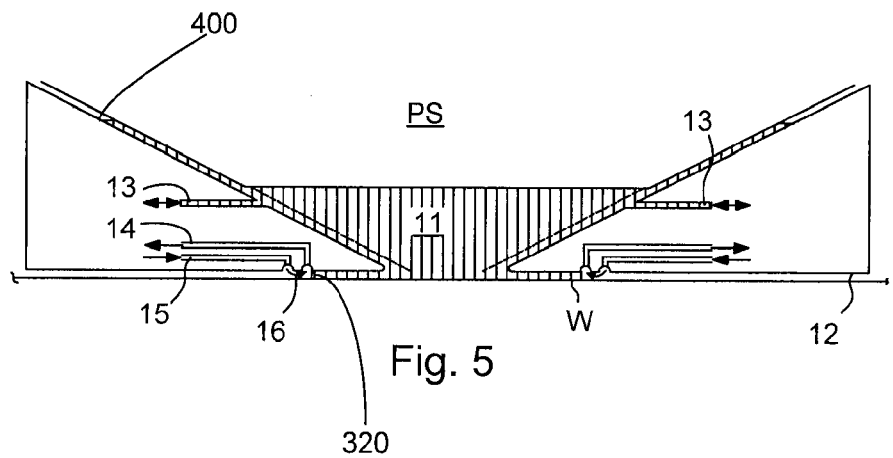
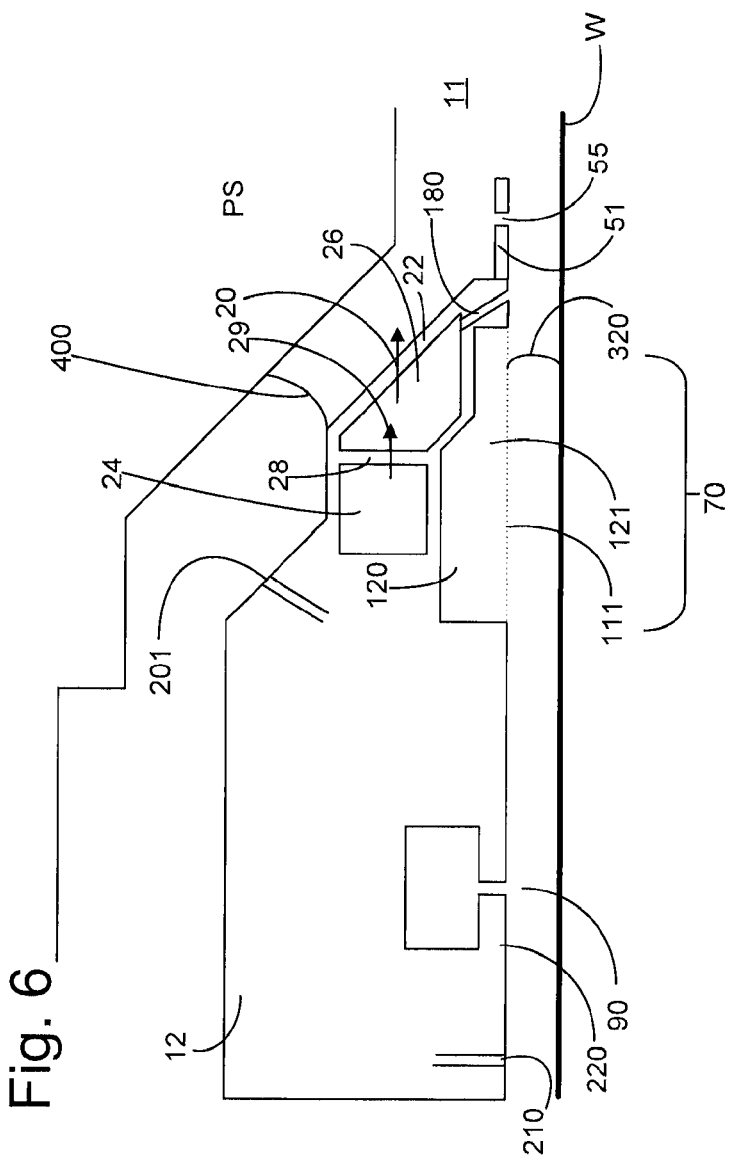

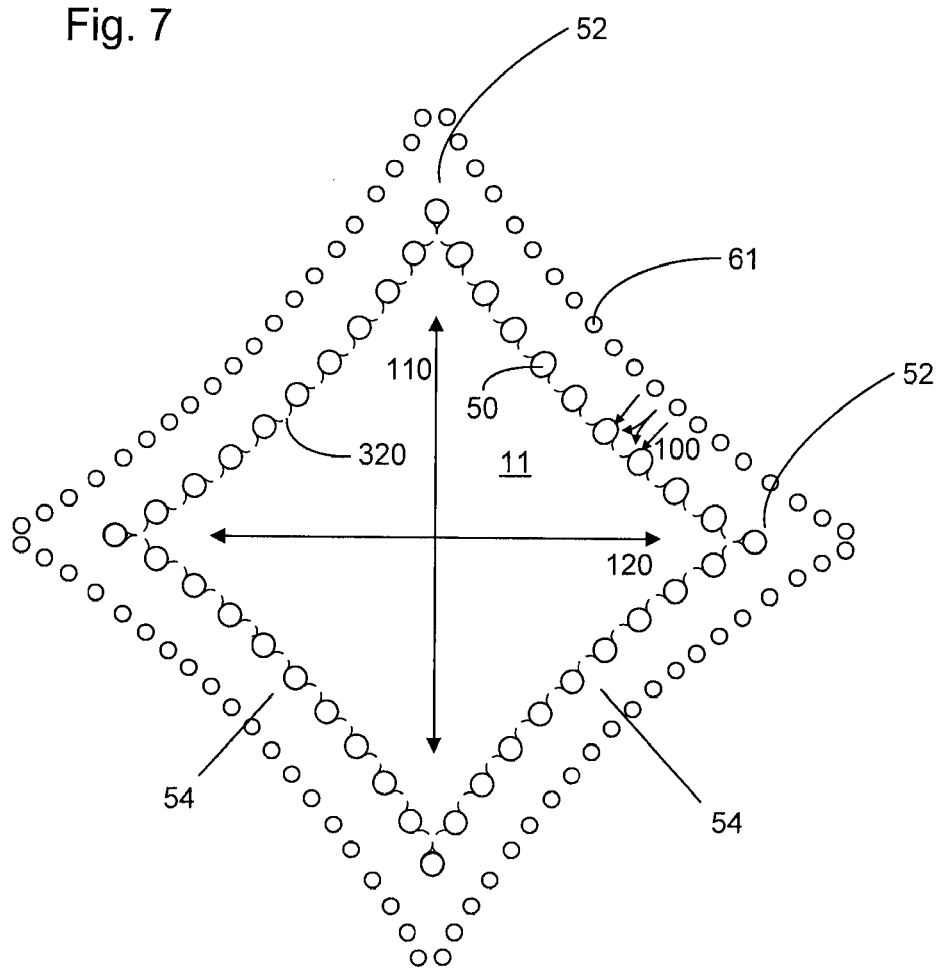

FLUID HANDLING STRUCTURE INCLUDING GAS SUPPLY AND GAS RECOVERY OPENINGS, LITHOGRAPHIC APPARATUS AND DEVICE MANUFACTURING METHOD

This application claims priority and benefit under 35 U.S.C. §119(e) to U.S. Provisional Patent Application No. 61/506,442, filed on Jul. 11, 2011 and to U.S. Provisional Patent Application No. 61/526,992, filed on Aug. 24, 2011. The content of those applications are incorporated herein in their entirety by reference.

FIELD

The present invention relates to a fluid handling structure, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

If the immersion liquid is confined by a fluid handling system to a localized area on the surface which is under the projection system, a meniscus extends between the fluid handling system and the surface. If the meniscus collides with a droplet on the surface, this may result in inclusion of a bubble in the immersion liquid. The droplet may be present on the surface for various reasons, including because of leaking from the fluid handling system. A bubble in immersion liquid can lead to imaging errors, for example by interfering with a projection beam during imaging of the substrate.

It is desirable, for example, to provide a lithographic apparatus in which the likelihood of bubble inclusion is at least reduced.

According to an aspect, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; a plurality of gas supply openings in a linear array at least partly surrounding and radially outward of the meniscus pinning feature; and a gas recovery opening radially outward of the plurality of gas supply openings in a linear array.

According to an aspect, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; an opening of a gas knife at least partly surrounding and radially outward of the meniscus pinning feature; and at least one gas recovery opening radially outward of the opening of the gas knife, the at least one gas recovery opening comprising a plurality of gas recovery openings of a similar or the same size.

According to an aspect, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; an opening of a gas knife at least partly surrounding and radially outward of the meniscus pinning feature; and at least one gas recovery opening radially outward of the opening of the gas knife, the at least one gas recovery opening comprising a plurality of gas recovery openings in a periodic pattern along a line.

According to an aspect, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; an opening of a gas knife at least partly surrounding and radially outward of the meniscus pinning feature; and at least one gas recovery opening radially outward of the opening of the gas knife, the at least one gas recovery opening comprising a plurality of gas recovery openings equidistantly spaced apart.

According to an aspect, there is provided a device manufacturing method, comprising: projecting a patterned beam of radiation through an immersion liquid confined to a space between a projection system and a substrate; providing gas through a plurality of gas supply openings in a linear array to a position adjacent a meniscus of the immersion liquid; and recovering liquid which passes through adjacent gas supply openings of the plurality of gas supply openings in a linear array through a gas recovery opening radially outward of the plurality of gas supply openings in a linear array.

According to an aspect, there is provided a device manufacturing method, comprising: projecting a patterned beam of radiation through an immersion liquid confined to a space between a projection system and a substrate; providing gas through an opening of a gas knife to a position adjacent a meniscus of the immersion liquid; and recovering liquid which passes the opening of the gas knife through at least one gas recovery opening radially outward of the opening of the gas knife, the at least one gas recovery opening comprising a plurality of gas recovery openings of a similar or the same size.

According to an aspect, there is provided a device manufacturing method, comprising: projecting a patterned beam of radiation through an immersion liquid confined to a space between a projection system and a substrate; providing gas through an opening of a gas knife to a position adjacent a meniscus of the immersion liquid; and recovering liquid which passes the opening of the gas knife through at least one gas recovery opening radially outward of the opening of the gas knife, the at least one gas recovery opening comprising a plurality of gas recovery openings in a periodic pattern along a line.

According to an aspect, there is provided a device manufacturing method, comprising: projecting a patterned beam of radiation through an immersion liquid confined to a space between a projection system and a substrate; providing gas through an opening of a gas knife to a position adjacent a meniscus of the immersion liquid; and recovering liquid which passes the opening of the gas knife through at least one gas recovery opening radially outward of the opening of the gas knife, the at least one gas recovery opening comprising a plurality of gas recovery openings equidistantly spaced apart.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 6 depicts, in cross-section, a further liquid supply system for use in a lithographic projection apparatus;

FIG. 7 depicts, in plan, a liquid supply system for use in a lithographic projection apparatus;

DETAILED DESCRIPTION

Figure 1:
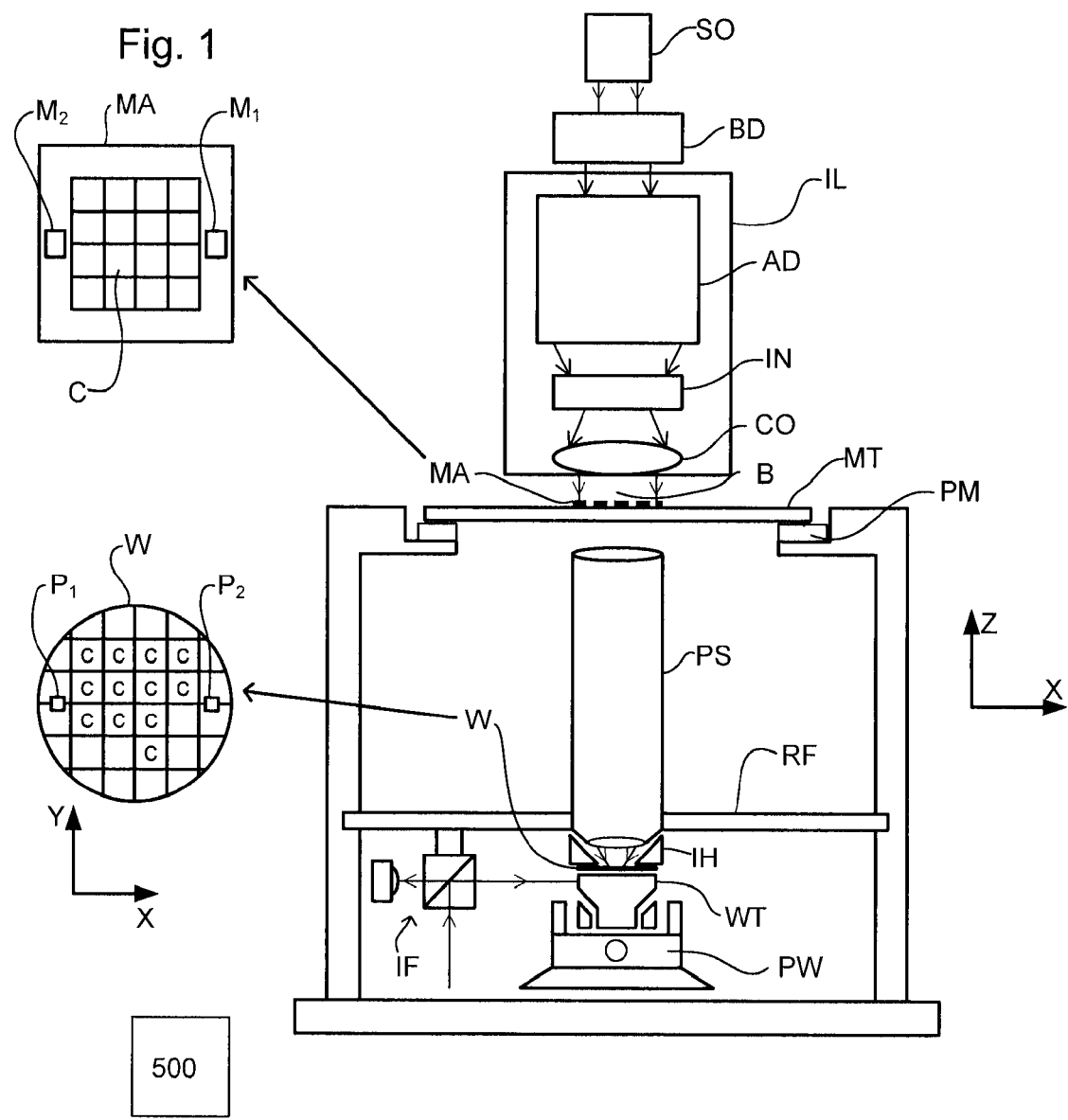
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-7 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
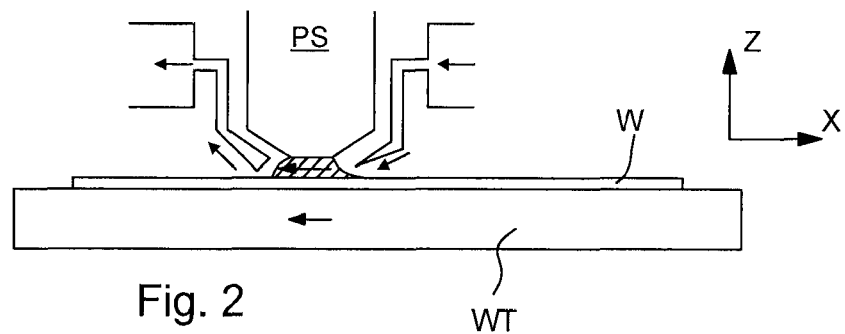
FIGS. 2 and 3 depict a liquid supply system for use in a lithographic projection apparatus.
Figure 3:
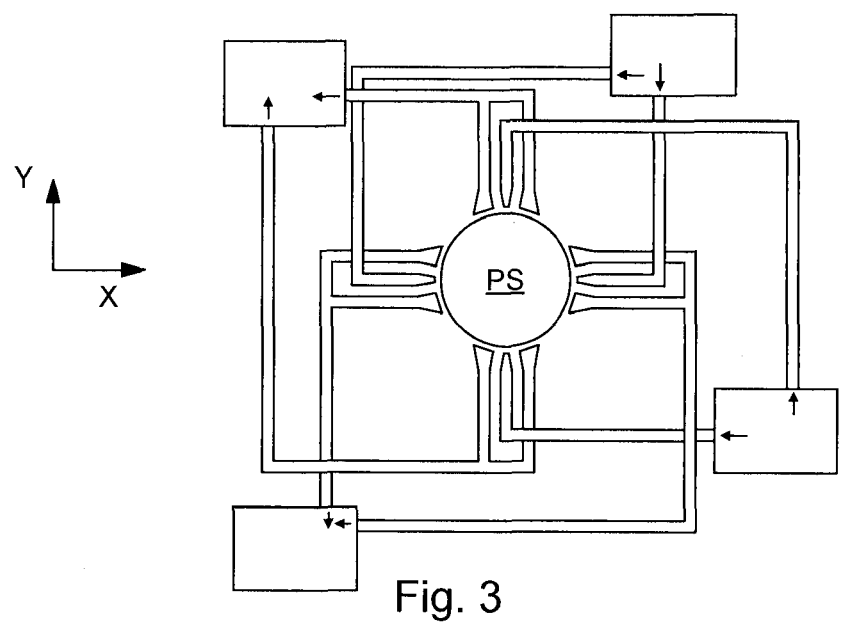

As illustrated in FIGS. 2 and 3, liquid is supplied by at least one inlet onto the substrate, desirably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
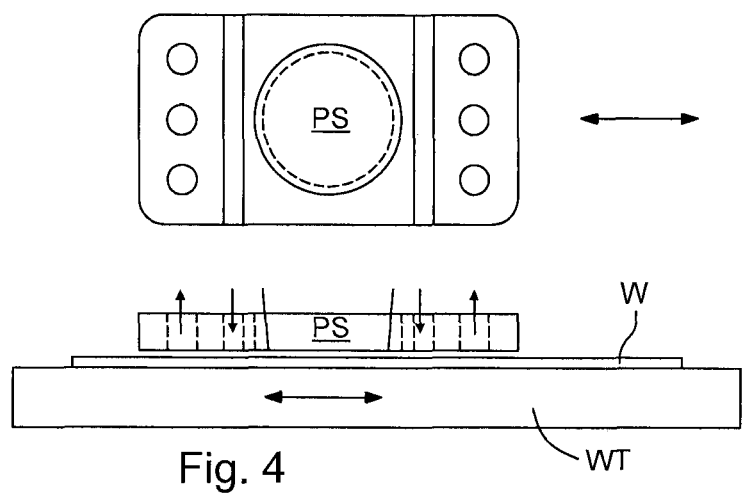
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

FIG. 5 schematically depicts a localized liquid supply system or fluid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the fluid handling structure 12 and the surface of the substrate W and may be a contactless seal such as a gas seal (such a system with a gas seal is disclosed in European patent application publication no. EP-A-1,420,298) or liquid seal.

The fluid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the fluid handling structure 12 positioned below and surrounding the final element of the projection system PS. Liquid is brought into the space below the projection system PS and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure 12 and the surface of the substrate W. The gas seal is formed by gas. The gas in the gas seal is provided under pressure via inlet 15 to the gap between the fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in U.S. patent application publication No. US 2004-0207824, which is hereby incorporated by reference in its entirety. In an embodiment, the fluid handling structure 12 does not have a gas seal.

FIG. 6 illustrates a fluid handling structure 12 which is part of a liquid supply system. The fluid handling structure 12 extends around the periphery (e.g. circumference) of the final element of the projection system PS.

A plurality of openings 20 in the surface which in part defines the space 11 provide the liquid to the space 11. The liquid passes through openings 29, 20 in side walls 28, 22 respectively through respective chambers 24, 26 prior to entering the space 11.

A seal is provided between the bottom of the fluid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow liquid therethrough; the opening 55 may be beneficial if the control plate 51 is displaced in the Z direction (e.g., parallel to the optical axis of the projection system PS). Radially outwardly of the flow control plate 51 on the bottom surface of the fluid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the fluid handling structure 12 and the facing surface. The extractor assembly 70 may operate as a single phase or as a dual phase extractor. The extractor assembly 70 acts as a meniscus pinning feature. The meniscus pinning feature may define, in use, a meniscus between the fluid handling structure and facing surface. The meniscus may be the outer extent, or boundary, at least under the fluid handing structure, of the liquid confined by the fluid handling structure.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in U.S. patent application publication No. US 2006-0038968, incorporated herein in its entirety by reference. In an embodiment, the liquid removal device 70 comprises an inlet which is covered in a porous material 111 which is used to separate liquid from gas to enable single-liquid phase liquid extraction. An under pressure in chamber 121 is chosen in such that the meniscuses formed in the holes of the porous material 111 substantially prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

The porous material 111 has a large number of small holes each with a dimension, e.g. a width, such as a diameter, in the range of 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than or equal to 90°, desirably less than or equal to 85° or desirably less than or equal to 80°, to the immersion liquid, e.g. water.

In an embodiment, the liquid supply system has an arrangement to deal with variations in the level of the liquid. This is so that liquid which builds up between the projection system PS and the liquid confinement structure 12 (forming, e.g., a meniscus 400) can be dealt with and does not escape. One way of dealing with this liquid is to provide a lyophobic (e.g., hydrophobic) coating. The coating may form a band around the top of the fluid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. An additional or alternative way of dealing with this liquid is to provide an outlet 201 to remove liquid reaching a certain point (e.g., height) relative to the liquid confinement structure 12 and/or projection system PS.

Another localized area arrangement is a fluid handling structure which makes use of a gas drag principle. The so-called gas drag principle has been described, for example, in U.S. patent application publication Nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the fluid handing structure for a given speed in the preferred direction compared to if the two outlets were aligned perpendicular to the preferred direction. However, an embodiment of the invention may be applied to a fluid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

FIG. 7 illustrates schematically and in plan meniscus pinning features of a fluid handling system or of a fluid handling structure 12 having an extractor embodying the gas drag principle and to which an embodiment of the present invention may relate. The features of a meniscus pinning device are illustrated which may, for example, replace the meniscus pinning arrangement 14, 15, 16 of FIG. 5 or at least the extractor assembly 70 shown in FIG. 6. The meniscus pinning device of FIG. 7 is a form of extractor. The meniscus pinning device comprises a plurality of discrete openings 50. Each opening 50 is illustrated as being circular, though this is not necessarily the case. Indeed one or more of the openings 50 may be one or more selected from: circular, elliptical, rectilinear (e.g. square, or rectangular), triangular, etc. and one or more openings may be elongate. Each opening has, in plan, a length dimension (i.e. in the direction from one opening to the adjacent opening) of greater than or equal to 0.2 mm, greater than or equal to 0.5 mm, or greater than or equal to 1 mm. In an embodiment, the length dimension is selected from the range of 0.1 mm to 10 mm or selected from the range of 0.25 mm to 2 mm. In an embodiment, the width of each opening is selected from the range of 0.1 mm to 2 mm. In an embodiment the width of each opening is selected from the range of 0.2 mm to 1 mm. In an embodiment the length dimension is selected from the range of 0.2 mm to 0.5 mm or selected from the range of 0.2 mm to 0.3 mm. Inlet openings like those of FIG. 6 (labeled 180) may be provided radially inwardly of the openings 50.

Each of the openings 50 of the meniscus pinning device of FIG. 7 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The openings 50 can be connected to a vacuum source and/or the atmosphere surrounding the fluid handling system (or confinement structure) may be increased in pressure to generate the desired pressure difference.

In the embodiment of FIG. 7 the openings are fluid extraction openings. Each opening is an inlet for the passage of gas, liquid or a two phase fluid of gas and liquid, into the fluid handling system. Each inlet may be considered to be an outlet from the space 11.

The openings 50 are formed in a surface of a fluid handling structure 12. The surface faces the substrate W and/or substrate table WT, in use. In an embodiment the openings are in a flat surface of the fluid handling structure 12. In an embodiment, a ridge may be present on the bottom surface of the substrate member. At least one of the openings may be in the ridge. The openings 50 may be defined by needles or tubes. The bodies of some of the needles, e.g., adjacent needles, may be joined together. The needles may be joined together to form a single body. The single body may form the cornered shape.

The openings 50 are the end of a tube or elongate passageway, for example. Desirably the openings are positioned such that in use they are directed, desirably face, to the facing surface, e.g. the substrate W. The rims (i.e. outlets out of a surface) of the openings 50 may be substantially parallel to a top surface of a part of the facing surface. An elongate axis of the passageway to which the opening 50 is connected may be substantially perpendicular (within +/−45°, desirably within 35°, 25° or even 15° from perpendicular) to the top of the facing surface, e.g., the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to pin the meniscus 320 between the openings 50 substantially in place as illustrated in FIG. 7. The gas flow helps maintain the liquid confined by momentum blocking, by a gas flow induced pressure gradient and/or by drag (shear) of the gas (e.g., air) flow on the liquid.

The openings 50 surround the space to which the fluid handling structure supplies liquid. The openings 50 may be distributed in an undersurface of the fluid handling structure. The openings 50 may be substantially continuously spaced around the space (although the spacing between adjacent openings 50 may vary). In an embodiment, liquid is extracted all the way around the cornered shape and is extracted substantially at the point at which it impinges on the cornered shape. This is achieved because the openings 50 are formed all the way around the space (in the cornered shape). In this way the liquid may be confined to the space 11. The meniscus may be pinned by the openings 50, during operation.

As can be seen from FIG. 7, the openings 50 are positioned so as to form, in plan, a cornered shape (i.e. a shape with corners 52). In the case of FIG. 7 this is in the shape of a rhombus, desirably a square, with curved edges or sides 54. The edges 54, if curved, have a negative radius. The edges 54 may curve towards the center of the cornered shape in areas away from the corners 52. An embodiment of the invention may be applied to any shape, in plan, including, but not limited to the shape illustrated, for example, a rectilinear shape, e.g. a rhombus, a square or rectangle, or a circular shape, a triangular shape, a star shape, an elliptical shape, etc.

The cornered shape has principal axes 110, 120 aligned with the major directions of travel of the substrate W under the projection system PS. This helps ensure that, below a critical scan speed, the maximum scan speed is faster than if the openings 50 were arranged in a circular shape. This is because the force on the meniscus between two openings 50 is reduced with a factor $\cos \theta$. Here $\theta$ is the angle of the line connecting the two openings 50 relative to the direction in which the substrate W is moving.

The use of a square cornered shape allows movement in the step and scanning directions to be at an equal maximum speed. This may be achieved by having each of the corners 52 of the shape aligned with the scanning and stepping directions 110, 120. If movement in one of the directions, for example the scan direction is preferred to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example selected from the range of about 90° to 120°, in an embodiment selected from the range of about 90° to 105°, in an embodiment selected from the range of about 85° to 105°).

Throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which $\theta$ is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If less than 90° were desired it would be necessary to select one direction to have corners with less than 90° with the result that the other corner would have an angle of greater than 90°.

There may be no meniscus pinning feature radially inwardly of the openings 50. The meniscus is pinned between the openings 50 with drag forces induced by gas flow into the openings 50. A gas drag velocity of greater than or equal to about 15 m/s, desirably about 20 m/s should be sufficient. The amount of evaporation of liquid from the substrate may be reduced thereby reducing both splashing of liquid as well as thermal expansion/contraction effects.

In an embodiment, at least thirty-six (36) discrete openings 50 each with a diameter of 1 mm and separated by 3.9 mm may be effective to pin a meniscus. In an embodiment, one hundred and twelve (112) openings 50 are present. The openings 50 may be square, with a length of a side of 0.5 mm, 0.3 mm, 0.25 mm, 0.2 mm, 0.15 mm, 0.1 mm or 0.05 mm. The total gas flow in such a system may be of the order of 100 l/min. In an embodiment the total gas flow is selected from the range of 50 l/min to 130 l/min, in an embodiment, 70 l/min to 130 l/min.

Other geometries of the bottom of the fluid handling structure 12 are possible. For example, any of the structures disclosed in U.S. patent application publication no. US 2004-0207824 or U.S. patent application publication no. US 2010-0313974 could be used in an embodiment of the present invention.

Localized area fluid handling structures 12 such as those described above, with reference to FIGS. 2-7, may suffer from bubble inclusion into the space 11. As can be seen, a meniscus 320 extends between the fluid handling structure 12 and the surface under the fluid handling structure 12. This meniscus 320 illustrated in FIGS. 5 and 6 defines the edge of the space 11. When the meniscus 320 and a droplet collide on the surface, for example a droplet of liquid which has escaped the space 11, a bubble of gas may be included into the space 11. Inclusion of a bubble into the space 11 is detrimental because a bubble of gas can lead to an imaging error. A droplet is usually left behind on the surface in one of at least three circumstances: (a) when the liquid handling device is located over the edge of a substrate W when there is relative movement between the fluid handling structure 12 and the substrate W; (b) when the fluid handling structure 12 is located over a step change in height of the facing surface facing the liquid confinement structure when there is relative movement between the fluid handling structure 12 and the facing surface; and/or (c) due to too high relative speed between the fluid handling structure 12 and the facing surface, for example when the meniscus becomes unstable, e.g. by exceeding the critical scan speed of the facing surface. One or more further features radially outward of the meniscus pinning feature, such as a gas knife, can be used to catch any escaped liquid.

In a fluid handling structure 12 such as that described in US 2010/0313974, a gas knife in the form of a slit opening (e.g. a continuous linear opening) is provided around the openings 50. A gas knife in the form of a slit opening may also be provided around the extractor 70 of the FIG. 6 embodiment. A gas knife in the form of a slit opening might typically have a width of 50 μm. However, such an opening can be difficult to manufacture and this can lead to variations in the pressure particularly radially inwardly of the gas knife, around the periphery (e.g., circumference) of the meniscus pinning feature. Additionally, a gas knife in the form of a slit may be particularly sensitive to the presence of contamination. This again leads to instability in under pressure around the periphery of the meniscus pinning feature. An embodiment of the present invention addresses one or more of these (and additionally or alternatively other) problems.

In an embodiment shown in FIGS. 6 and 7, a plurality of gas supply openings 61 (i.e. discrete apertures) are provided in a linear array. Relative to the space, the gas supply openings 61 are provided radially outward of the meniscus pinning feature (the extractor 70 and openings 50, respectively). The linear array made by the gas supply openings 61 may be substantially parallel to the lines joining the openings 50. In use, the gas supply openings 61 are connected to an over pressure and form a gas knife (supplying a gas, e.g. air) surrounding the meniscus pinning device. The plurality of gas supply openings 61 in a linear array (e.g. a one or two dimensional linear array) at least partly surround the meniscus pinning feature.

One example of a linear array is a line. One example of a linear array comprises two or more rows of openings. The openings may be periodically arranged along the linear array. For example the openings along the rows may be staggered. In one or more of the rows of openings, each of the openings may be aligned in a line. The openings in two of the rows may be staggered with respect to each other (i.e. two lines of holes).

In an embodiment the plurality of gas supply openings 61 are of a similar, e.g. the same, size. In an embodiment, the gas supply openings 61 are all within a percentage, e.g. 5%, of a pre-determined size. In an embodiment the plurality of gas supply openings 61 are arranged in a periodic pattern along a line i.e. a repeating series of holes with different gaps between each of the holes in the series, for example two holes spaced closely apart followed by a gap and then two holes spaced closely apart followed by a gap, etc. In an embodiment the plurality of gas supply openings 61 are equidistantly spaced apart. In an embodiment a line along which adjacent openings are arranged is straight. In an embodiment the plurality of gas supply openings 61 are arranged to ensure a substantially uniform flow of gas out of the gas supply openings 61 per unit length.

In an embodiment, the gas supply openings 61 function to reduce the thickness of a liquid film left on a facing surface, such as the substrate W or substrate table WT, in passage under the fluid handling structure 12, for example a droplet moving relatively towards meniscus 320 from radially outward of the linear array, or a droplet relatively moving from the meniscus 320 radially outwardly. With the substantially same flow rate through the plurality of gas supply openings 61 (for example with a diameter of 90 μm and 200 μm pitch) a higher average pressure peak under the openings may be achieved than for a slit gas knife with a slit width of, for example, 50 μm, using the same flow rate. The discrete gas supply openings 61 therefore may cause a thinner liquid film to be left on the facing surface after passage of the liquid film under the fluid handling structure 12. The higher average pressure peak may result in improved efficiency in stopping droplets moving relative to the meniscus 320. The higher average pressure peak may result in even better performance when the gap between the edge of a substrate W and the substrate table WT is crossed. When using a slit gas knife, the pressure peak under the slit may collapse because the gas flow out of the slit can be sucked away through the openings 50. The pressure peak of the plurality of gas supply openings 61 may be less likely to be sucked away through openings 50. This may result in better performance as the pressure peak is more stable (see FIG. 10, described later).

The gas supply openings 61 may help to ensure that the liquid film does not break into droplets but rather the liquid is driven towards the openings 50 and extracted. In an embodiment the gas supply openings 61 operate to prevent the formation of a film. The linear array in which the gas supply openings 61 are arranged generally follows the line of the meniscus pinning feature (e.g. openings 50). Thus the distance between adjacent meniscus pinning features (e.g. openings 50) and the gas supply openings 61 is within 0.5 mm to 4.0 mm, desirably 2 mm to 3 mm. The distance between the gas supply openings 61 and openings 50 can be small while still reducing the risk of bubbles derived from droplet collision with the meniscus 320, compared to a slit gas knife.

In an embodiment the linear array in which the gas supply openings 61 are arranged is substantially parallel to the line of the meniscus pinning feature (e.g. openings 50). In an embodiment a substantially constant separation between adjacent ones of the meniscus pinning feature (e.g. openings 50) and the gas supply openings 61 is maintained.

In an embodiment the plurality of gas supply openings 61 in a linear array acts as a gas knife.

A slit may be formed in an immersion fluid handling structure 12, which might be made of stainless steel, by bolting together blocks of metal with a suitable distance between the blocks to form the slit. However, it may be difficult to achieve the desired and/or a constant slit width. By contrast, the discrete gas supply outlets 61 may be formed by ablation, for example, using a laser to burn material away. This may result in greater uniformity of opening cross-section, dimension and location. It may be possible to drill the openings (which are desirably round, in cross section, because this is easiest to manufacture) with an accuracy of 5%. By contrast, a slit of 50 µm may have a tolerance of +/−10 µm which is about +/−20%.

A plurality of discrete gas supply openings 61 in a linear array may not be as sensitive to contamination or variation in size as a slit gas knife because the opening is larger (e.g. 100 µm) compared to a slit width (of say 50 µm).

A gas knife should have one or more sharp edges to help ensure good gas knife functionality. The edge may be damaged by contact with an object (for example with the substrate, which may happen during zeroing of the working distance (the distance between the fluid handling structure 12 and the facing surface)).

As a result of potential better manufacturability and less susceptibility to contamination and damage, the use of discrete gas supply openings 61 instead of a slit gas knife may result in better uniformity of pressure on the meniscus 320. In practice, an increase in gas flow through the discrete openings 61 compared to that which can be provided using a slit opening may be achieved (even though theoretically a slit might be expected to perform better). At a corner of the shape of a gas knife feature (e.g. arrangement of discrete openings or a slit), in plan, a problem can arise with a slit gas knife which may not occur with the use of discrete gas supply openings 61.

Using discrete openings, the flow rate out of the discrete gas supply openings 61 may be increased by a factor of up to 1.5 compared to the flow out of openings 50 without disturbing the meniscus 320. At such a flow rate an equivalent slit gas knife (i.e. one with the same open area per unit length) would result in an unstable meniscus 320, particularly when crossing the edge of the substrate or a step change in height on the substrate table WT. However, at such flow settings, for an equivalent discrete gas knife arrangement, the meniscus has greater stability.

In order for the discrete gas supply openings 61 to exhibit gas knife like functionality, an open area of less than or equal to $6.0 \times 10^{-5}$ m² per meter length is desirable. This equates to the same open area per unit length as a gas knife with a slit width of 60 µm. In an embodiment the open area per meter length is less than or equal to $5.0 \times 10^{-5}$ m², less than or equal to $4.0 \times 10^{-5}$ m² or less than or equal to $3.5 \times 10^{-5}$ m². The lower the open area ratio, the higher the maximum achievable pressure under each opening and the more like a raking action may be achieved. However, if the open area becomes too small the gas knife functionality is lost because of the impossibility of reducing the pitch between adjacent gas supply openings to less than or equal to 180 µm. In an embodiment the open area per meter length is greater than or equal to $1.0 \times 10^{-5}$ m², greater than or equal to $2.0 \times 10^{-5}$ m², or greater than or equal to $2.5 \times 10^{-5}$ m². Larger open areas are desirable as this allows larger gas flows and therefore higher achievable pressure.

In an embodiment the gas supply openings 61 are circular (round) in cross-section. In an embodiment the diameter or maximum dimension in the case of a non-circular opening 61 is less than or equal to 125 µm, desirably less than or equal to 115 µm. This equates to an area per opening of at most (calculated for the case of a square opening) $1.6 \times 10^{-8}$ m², desirably at most $1.3 \times 10^{-8}$ m². In an embodiment, the maximum hole diameter is 200 µm.

Theoretical calculations indicate that the hole diameter of the gas supply openings 61 should be at least ½ the working distance which is the distance between the bottom surface of the fluid handling structure 12 and the facing surface (e.g. substrate W). A typical distance between the under surface of the fluid handling structure 12 and the facing surface (working distance or fly height) is 150 µm, indicating a minimum hole diameter of 75 µm in an embodiment. If this requirement is met, the core of the gas jet exiting the gas supply opening 61, which is not disturbed by the stagnant environment which the jet penetrates, reaches the facing surface and so a large pressure gradient is generated.

In an embodiment the discrete gas supply openings 61 have a diameter or minimum dimension in the case of a non round opening 61 of greater than or equal to 80 µm, more desirably greater than or equal to 90 µm. A cross-sectional area of greater than or equal to $5.0 \times 10^{-9}$ m² per meter length or greater than or equal to $6.4 \times 10^{-9}$ m² per meter length is therefore desirable. This range of hole sizes makes a balance between the ability to manufacture (at the lower size range), and the maximum allowable pitch between adjacent gas supply openings 61 (at the upper size range). That is, the maximum allowable pitch is related to the pitch which can lead to the minimum pressure being above a predefined minimum (e.g. 50 mbar) between adjacent openings 61. Additionally, if too little material is left between adjacent openings, this can result in weakness and potential breakage and this leads to a maximum hole diameter.

In an embodiment, the pitch between adjacent gas supply openings 61 is greater than or equal to 180 µm, desirably greater than or equal to 200 µm. Conversely, the pitch should be less than or equal to 400 µm, desirably less than or equal to 200 µm, and more desirably less than or equal to 280 µm. These ranges strike a balance between strength and joining together of gas streams from adjacent openings and thereby provide a large minimum pressure between openings (of at least 30 mbar, desirably at least 50 mbar).

In an embodiment, in order for the minimum desired pressure between adjacent holes of the plurality of gas supply openings 61 in a line to be achieved, the length of material between adjacent holes should be a maximum of half the distance between the bottom surface of the fluid handling structure 12 and the facing surface. This gives a minimum length of material of 75 µm. In an embodiment, the pitch is chosen such that gas jets out of each discrete gas supply opening 61 overlap with an adjacent discrete gas supply opening. The gas jet tends to spread out with a one over four shape. Therefore in an embodiment, for the jets to overlap the gas supply openings 61 should be less than or equal to 2 times ¼ of the working distance apart or ½ the working distance apart or less.

In an embodiment, material present between adjacent openings 61 should be at least 80 µm long, or at least 90 µm long to provide sufficient strength.

More than or equal to 200 µm of material between adjacent openings 61 may be unnecessary and may lead to separation of gas jets and thereby a pressure of less than or equal to 30 mbar between openings. In an embodiment at most a distance of 150 µm between adjacent gas supply openings 61 may be provided.

In an embodiment, the gas supply openings 61 have a diameter of 125 µm and a pitch of 300 µm which results in an open area of $5.8 \times 10^{-5}$ m$^2$ per meter. If the pitch is reduced to 180 µm, the open area rises to $9.8 \times 10^{-5}$, but in some circumstances that may be too much and only leaves a length of 55 µm of material between openings 61. In an embodiment the opening 61 diameter is 80 µm, this leads to an open area of $2.79 \times 10^{-5}$ m$^2$ per meter with a pitch of 180 µm which is close to equivalent to a slit width of 30 µm.

The possible improvement in manufacturability and stability of the meniscus relative to a slit gas knife is beyond the expectation of the inventors and may provide one or more other unexpected benefits as described herein. Holes of larger dimensions, e.g. 100 µm diameter and a pitch of 200 µm, for example, can be made with greater consistency and accuracy than a slit of smaller dimension, say 50 µm. The resulting gas flow may therefore be more predictable and more effective. In addition, because the maximum dimension of an opening of a discrete gas supply opening 61 (e.g. diameter) is larger than the maximum dimension of a slit gas knife (e.g. slit width), a gas knife comprising a plurality of discrete gas supply openings 61 may be more robust over a larger range of working distances and less sensitive to contamination.

In an embodiment a large pressure gradient exists in a direction going between adjacent gas supply openings 61 and this may result in droplets moving to the point of lowest pressure between openings 61. Here droplets can conglomerate. Some droplets may pass at the point of lowest pressure between gas supply openings 61. Therefore, as illustrated in cross section in FIG. 6 and in plan in FIG. 8, in an embodiment at least one extraction opening 210 is provided radially outwardly of the plurality of discrete gas supply openings 61 in a linear array.

In an embodiment the at least one extraction opening 210 may be a plurality of extraction openings 210. In an embodiment at least one extraction opening 210 is a slit opening (i.e. continuous). This embodiment is advantageous in that a droplet, irrespective of where it passes the plurality of gas supply openings 61, is collected. In an embodiment each space between adjacent gas supply openings 61 has a corresponding extraction opening 210. In an embodiment the extraction openings 210 are a plurality of gas extraction openings in a linear array (e.g. a line).

In an embodiment where the at least one extraction opening 210 is a plurality of extraction openings 210, the gas knife may be in the form of a slit or continuous opening. That is, the plurality of gas supply openings 61 described in FIG. 8 actually comprise a slit (i.e. continuous) opening.

Figure 9:
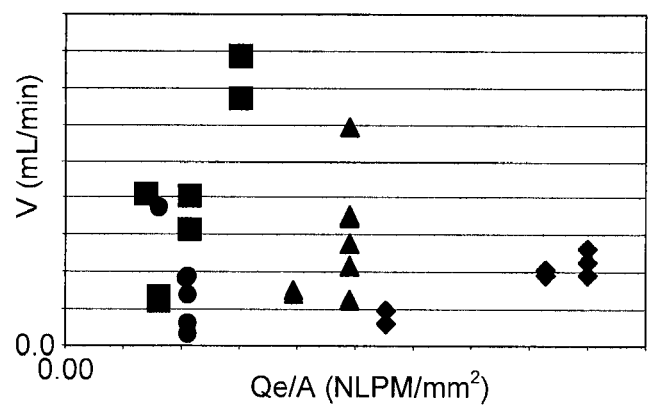
FIG. 9 is a graph of extracted water flow on the y axis versus effective flow per surface area on the x axis for four different arrangements of extraction openings.

An advantage of using a plurality of discrete extraction openings 210, irrespective of whether the gas knife is in the form of a slit or plurality of gas supply openings 61, is reducing in flow in order to remove liquid which passes the gas knife. Calculations based on assumptions about the physical quantity of liquid needed to be extracted out of the extraction openings and empirical relationships between underpressure and flow dependent upon opening size and geometry can be made. Such calculations show that a flow rate of between 10 and 20 l/min should be provided for a set of discrete extraction openings with a diameter of 80 µm, a pitch of 250 µm and a peripheral length of between 200 and 350 mm. In contrast, if the extraction opening 210 is in the form of a slit of 100 µm width, a flow rate of a factor of five times higher can be calculated as being required. Experiments show a similar improvement in flow. FIG. 9 illustrates for four different types of extraction openings 210 results of extracted water flow on the y axis (in mL per minute) versus effective gas flow per surface area (in nano liters per minute per mm$^2$). Results for extraction openings 210 with a hole diameter of 100 µm and a pitch of 200 µm are shown as diamonds, the results for a slit opening with an opening width of 50 µm are shown as triangles, the results for a slit opening with an opening width of 100 µm are shown as circles and the results for a slit opening with an opening width of 150 µm are shown as squares. All experiments were carried out with a working distance between the undersurface of the fluid handling structure and the facing surface of 150 µm. In the experiment a water droplet was moved under the extraction openings 210 and the extracted water flow V and effective flow per surface area Qe/A was noted. These results show that for a given extracted water flow (i.e. for a given amount of liquid which needs to be extracted by the extraction openings 210) the effective gas flow per surface area of the discrete extraction openings is a factor of 4 times more efficient than for a slit opening with a width of 100 or 150 µm. The effective gas flow per surface area of the discrete extraction openings of the discrete extraction openings is a factor of 2 times more efficient than for a slit opening with a width of 50 µm.

In order to balance the gas flows between the openings 50, the gas supply openings 61 and extraction openings 210, a certain flow rate into the extraction openings 210 should be provided. The experimental results in FIG. 9 show that for a given flow rate into the extraction openings 210, the use of discrete extraction openings 210 results in a higher flow rate into the extraction openings 210 which results in more efficient extraction of liquid. Further advantages are that lower forces are applied between the fluid handling structure and the facing surface (because of the smaller total area of the openings) and/or that less gas flow can be used. Additionally, discrete openings have less influence on the pressure peak (see FIG. 10 and related description below) of the gas supply openings 61 than a slit.

An advantage of having a lower extraction flow rate is that the fluid handling structure is less sensitive to imbalances in flow between the openings 50, gas supply opening 61 and extraction openings 210. Robustness in terms of sensitivity to the presence of contamination may be improved. Additionally manufacturability may be improved as it is less time consuming and technically easier to make holes compared to a slit, as described elsewhere. Furthermore, the system may result in fewer droplets between the gas supply opening(s) 61 and the outer extraction openings 210. In the case of a plurality of gas supply openings 61, droplets of liquid can be steered towards a discrete extraction opening 210 which corresponds in position to the gap between the gas supply openings 61, as described elsewhere. Further, because a lower gas flow rate into extraction openings 210 is possible, a lower static force may be applied between the fluid handling structure 12 and the facing surface (e.g. substrate) which is advantageous in terms of control of position of the substrate.

A droplet which passes the linear array of gas supply openings 61 will pass at a position of lowest pressure. As a result, the droplet will pass substantially equidistant between adjacent openings 61. Therefore, by positioning of the extraction opening 210 substantially equidistant between adjacent openings 61 as described above (i.e. at a position which bisects the space between adjacent openings 61), a droplet which passes the linear array of gas supply openings 61 is likely to pass under an extraction opening 210 corresponding to the space through which the droplet has moved. As a result, the droplet is likely to be extracted by the extraction opening 210. An extraction takes place if the droplet touches the extraction opening 210 and so the effect of the tangential pressure gradient which results in conglomeration of droplets is advantageous as this leads to larger droplets which are more likely to touch the extraction openings 210.

The extraction openings 210 may have the same characteristics and/or dimensions as the gas supply openings 61 described above. The at least one extraction opening 210 may be discontinuous, continuous, a two dimensional linear array (e.g. two substantially parallel lines of openings), etc.

In an embodiment, the distance between the at least one extraction opening 210 and the plurality of gas supply openings 61 is at least 0.2 mm and at most 1.0 mm. This relatively short distance is advantageous because droplets are more likely to be captured. If the distance is too short, this can led to interference between the gas flows out of the gas supply openings 61 and into the extraction openings 210 which is undesirable.

Figure 8:
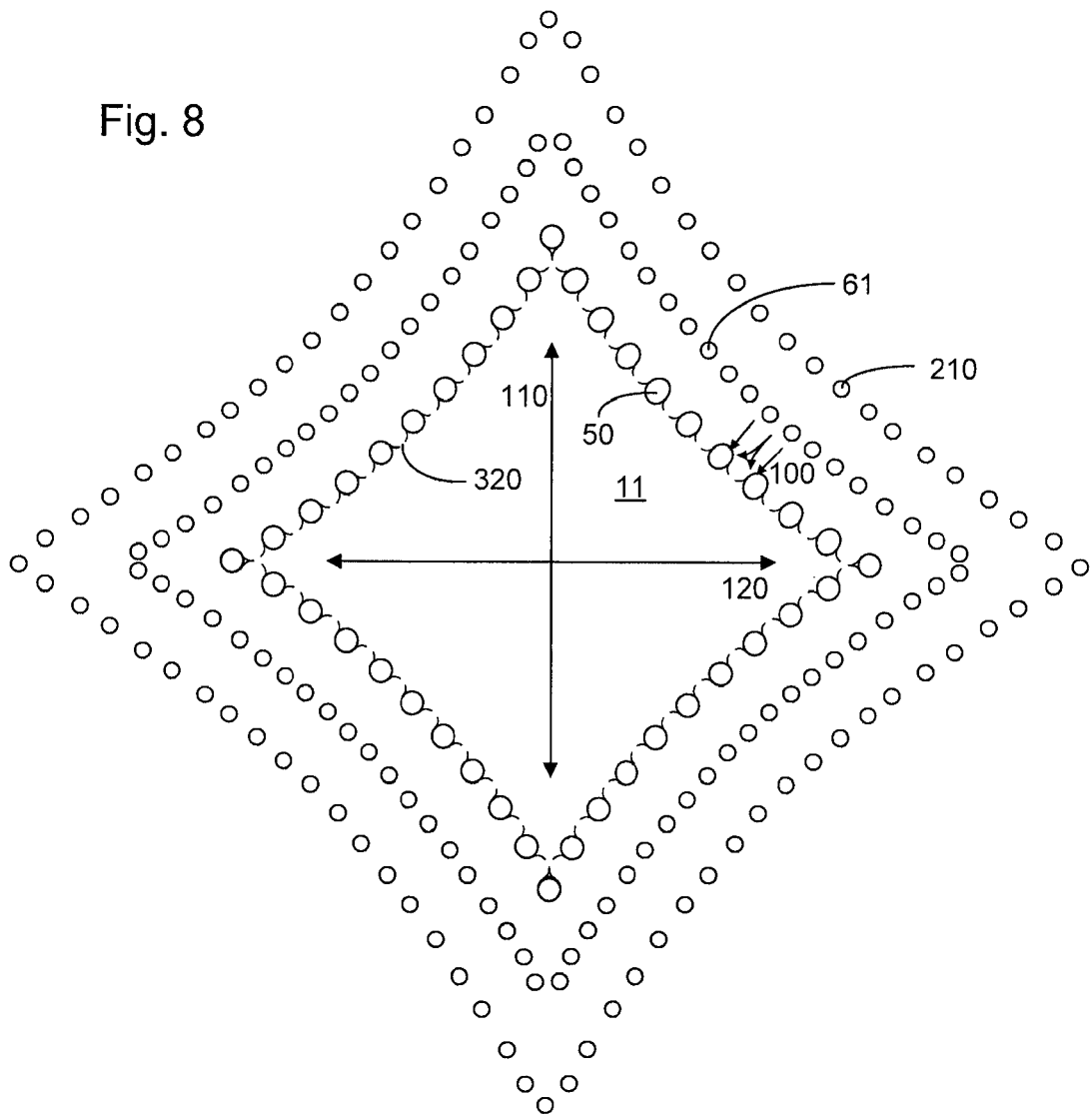
FIG. 8 depicts, in plan, a liquid supply system for use in a lithographic projection apparatus.
Figure 10:
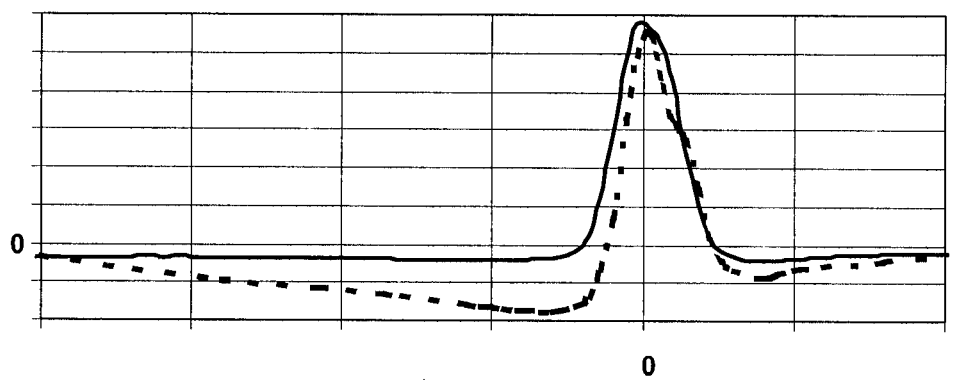
FIG. 10 is a graph of radial distance on the x axis vs pressure on the y axis.
Figure 11:
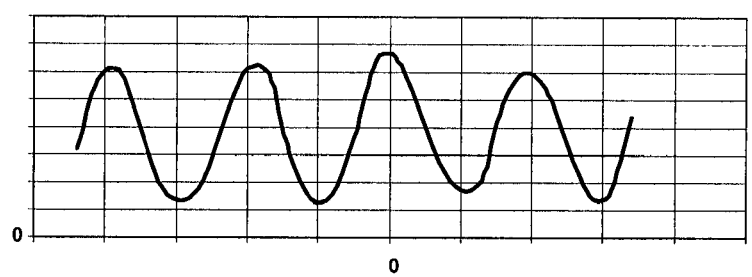
FIG. 11 is a graph of lateral distance on the x axis vs pressure on the y axis.

The under pressure generated radially inwardly of the plurality of discrete gas supply openings 61 and radially outwardly of the openings 50 may be lower and more constant, radially and tangentially, than the under pressure generated by a gas knife in the form of a slit. FIG. 10 illustrates this phenomenon. FIG. 10 (and FIG. 11) is applicable both to the embodiment without at least one extraction opening 210 (as illustrated in FIG. 7) as well as to the embodiment with at least one extraction opening 210 (as illustrated in FIG. 8). FIGS. 10 and 11 were determined using an embodiment according to FIG. 8.

FIG. 10 plots radial distance on the x axis, with negative numbers being radially inward of the gas supply openings 61 or gas knife, versus relative pressure at substrate level on the y axis. An example gas knife with a slit of 50 μm is shown as dotted lines and shows a maximum under pressure of the order of −50 mbar which decreases towards −10 mbar as the openings 50 are approached. In contrast, for an example plurality of discrete gas supply openings 61 with a opening diameter of 100 μm and a pitch of 200 μm, the minimum pressure is −10 mbar. This is advantageous because it may result in a decrease in the attractive force between the fluid handling structure 12 and the facing surface. Additionally, it may result in fewer and smaller droplets being present between the openings 50 and the discrete gas supply openings 61. That may result in the risk of gas bubbles in the immersion liquid in the space 11 being reduced. Additionally, with the discrete openings 61, the pressure radially inward may be relatively constant along the majority of the length between the opening 50 and the gas supply openings 61. This is advantageous because the large pressure gradient generated using a slit gas knife may result in turbulent flow and this may be avoided using the discrete openings 61.

The experiments of FIG. 10 were carried out with a distance between the under surface of the fluid handling system 12 and the facing surface (e.g. substrate) being 150 μm, with a flow rate out of the openings 50 of 30 l/min, a flow rate through the gas knife or gas supply openings 61 of 45 l/min and a flow rate from extraction openings of 30 l/min.

FIG. 11 shows the relative change in pressure along the length of the linear array of the plurality of discrete gas supply openings 61. The same operating conditions as described above with relation to FIG. 10 are present. As can be seen, a maximum pressure is achieved under each gas supply opening 61 with a minimum pressure reached between adjacent openings 61. As can be seen, there is a drop in pressure between adjacent gas supply openings 61. Advantageously the drop in pressure is less than a drop to zero so that a force will be felt by a droplet at that location. This is advantageous because there is then a resistance to the passing of a droplet all around the meniscus pinning feature (because a positive pressure exists under the gas supply openings 61 all the way around the linear array of gas supply openings 61).

The pressure profile such as in FIG. 11 is advantageous over that of a slit gas knife in that the pressure profile has a series of peaks and troughs sufficient to aggregate small droplets of harmless size. This means that pressure radially outward of the meniscus 320 can fluctuate as gas can more easily pass the pressure profile. As a result the meniscus 320 may be stabilized which may mean less liquid loss from the meniscus 320. Additionally, when the gap between the edge of the substrate W and the substrate table WT passes under the plurality of discrete openings 61, immersion liquid in that gap may be less likely to be forced out and so the risk of bubble inclusion is reduced.

In the discrete gas supply opening 61 example of FIGS. 10 and 11, only very fine droplets (smaller than 50 μm in diameter) may be formed when the edge of the substrate W crosses under the fluid handling structure 12. This compares with droplets up to an order of magnitude larger using a slit gas knife. Therefore, the risk of bubble inclusion by collision of a large droplet with the meniscus 320 is greatly reduced.

Figure 12:
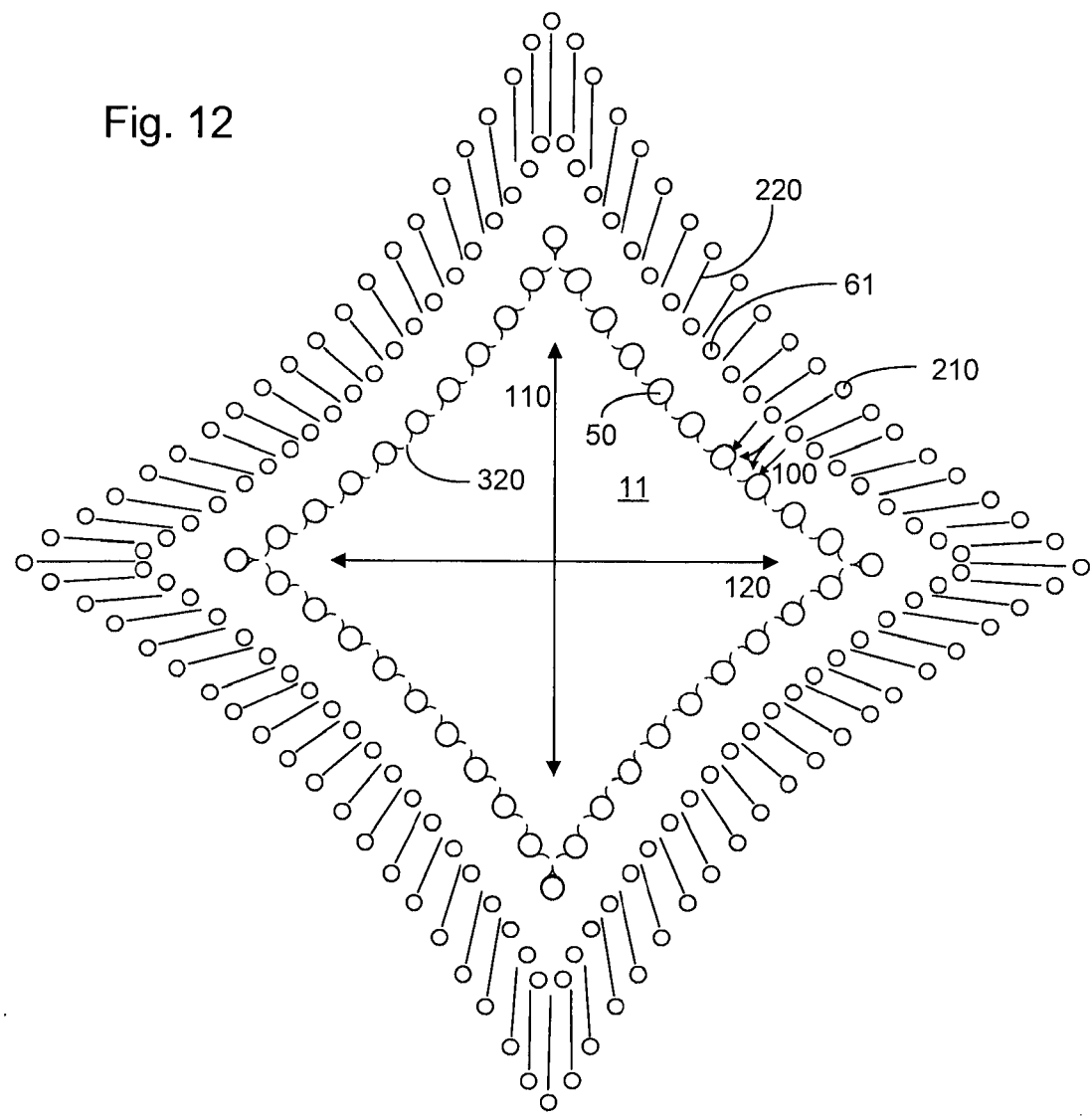
FIG. 12 depicts, in plan, a liquid supply system for use in a lithographic projection apparatus.

As illustrated in cross-section of FIG. 6 and in plan in FIG. 12, in an embodiment one or more grooves 220 may extend between the space between adjacent gas supply openings 61 and the corresponding extraction opening 210 (only one is illustrated). The grooves 220 are formed on the under surface of the fluid handling structure 12. The grooves 220 are effective to guide liquid present in the space between the adjacent gas supply openings 61 to the corresponding extraction opening 210. The grooves 220 extend in a direction which passes through the space 11 occupied by immersion liquid, in use.

In an embodiment the grooves extend in a direction which passes through the space 11 and through the corresponding extraction opening 210. In an embodiment the direction passes substantially through the center of the space 11. During periods when the direction of relative motion between the fluid handling structure 12 and the facing surface is changed, the grooves facilitate extraction of droplets towards the extraction openings 210. That is, if after a droplet has passed under the space between adjacent gas supply openings, the relative direction of travel between the fluid handling structure 12 and facing surface changes, the droplet may no longer travel in a direction relative to the fluid handling structure 12 towards an extraction opening 210. The grooves 210 help in applying a force to such droplets and thereby direct them towards an extraction opening 210. Further details of grooves 220 are given in U.S. patent application publication No. US 2011-0194084.

In an embodiment each groove 220 has a width of at least 40 μm, desirably at least 50 μm. In an embodiment the groove 220 has a width of at most 150 μm, desirably at most 100 μm. Grooves in this size range may be particularly effective at guiding droplets and/or providing a capillary force on the droplets to pull them towards the corresponding extraction opening 210. In an embodiment, the groove 220 has a depth of at least 50 μm, desirably at least 100 μm. In an embodiment the groove has a depth of at most 500 μm, desirably at most 300 μm.

In an embodiment each groove has a cross-sectional shape or geometry. A groove cross-sectional geometry may be rectangular or triangular (or V-shaped). A groove having a triangular cross-sectional shape may exhibit enhanced capillary spreading of a liquid droplet relative a groove having a rectangular cross-sectional shape and thus may be preferred. A triangular cross-sectional shape has a characteristic angle formed between the sides of the groove. The characteristic angle may be in the range of 40 to 45 degrees. In an embodiment, to help ensure effectiveness of the groove in guiding liquid, the contact angle of the material forming the undersurface of the fluid handling structure (i.e. in which the groove is formed) has a contact angle less than the characteristic angle of the groove. Desirably the contact angle of the material is 40 degrees of less.

The grooves 220 can be used with a gas knife of a single slit opening or a plurality of gas supply openings 61 with an extraction opening 210 in the form of a slit or in the form of a plurality of discrete openings.

A controller 500 is provided to control the flow rates and adjustment of the flow rates can change the pressure gradients in both the peripheral (e.g., circumferential) and tangential directions as illustrated in FIGS. 10 and 11. The flow rates and dimensions of the features of the under surface of the fluid handling structure 12 can be adjusted to achieve the desired pressure profiles including the lowest negative pressure in the space between the gas supply openings 61 and the opening 50 as illustrated in FIG. 10 as well as in helping to ensure that the minimum pressure between adjacent gas supply openings 61 (as described above with reference to FIG. 11) is at an acceptable level.

Very small bubbles of gas may dissolve in the immersion liquid before they reach the exposure area of the space 11. In an embodiment, which can be combined with any other embodiment, the fact that dissolution speed is dependent upon the type of the trapped gas and the immersion liquid properties is used.

A bubble of carbon dioxide ($CO_2$) typically dissolves faster than a bubble of air. A bubble of $CO_2$ which has a solubility fifty-five (55) times larger than that of nitrogen and a diffusivity of 0.86 times that of nitrogen will typically dissolve in a time thirty-seven (37) times shorter than the time for a bubble of the same size of nitrogen to dissolve.

U.S. patent application publication No. US 2011-0134401, hereby incorporated in its entirety by reference, describes supplying a gas with a solubility in the immersion liquid greater than or equal to $5\times10^{-3}$ mol/kg at 20° C. and 1 atm total pressure to a region adjacent the space 11. It also describes supplying a gas with a diffusivity in the immersion liquid greater than or equal to $3\times10^{-5}$ cm$^2$ s$^{-1}$ at 20° C. and 1 atm total pressure to a region adjacent the space 11. It also describes supplying a gas with a product of diffusivity and solubility in the immersion liquid of greater than that of air at 20° C. and 1 atm total pressure to a region adjacent the space 11.

If the bubble of gas is of a gas which has a high diffusivity, solubility or product of diffusivity and solubility in the immersion liquid, it will dissolve into the immersion liquid much faster. Therefore, using an embodiment of the invention should reduce the number of imaging defects thereby allowing higher throughput (e.g., higher speed of the substrate W relative to the liquid handling structure 12) and lower defectivity.

Therefore, an embodiment of the present invention provides a gas supplying device configured to supply gas to a region (e.g. to a volume, or a towards an area) adjacent the space 11. For example, gas is provided such that it is present in the region adjacent to the meniscus 320 extending between the facing surface and the liquid handling structure 12.

An example gas is carbon dioxide which may be desirable because it is readily available and may be used in immersion systems for other purposes. Carbon dioxide has solubility in water at 20° C. and 1 atm total pressure of $1.69\times10^{-3}$ kg/kg or $37\times10^{-3}$ mol/kg. Any non-reactive gas which readily dissolves in immersion liquid is suitable.

An embodiment of the present invention herein described may form a $CO_2$ atmosphere around the meniscus 320, 400 of immersion liquid so that any inclusion of gas into the immersion liquid creates a gas inclusion which dissolves in the immersion liquid.

By using gaseous $CO_2$ the problem associated with the meniscus colliding with a droplet of liquid may be reduced if not alleviated. Typically a droplet of 300 micrometers would produce a bubble of 30 micrometers in diameter (i.e. a tenth the size). Such a bubble of carbon dioxide would usually dissolve in the immersion liquid before reaching the exposure area. (Note that a droplet of such a size may cause one or more other problems). Therefore the problems caused by a droplet could be less significant. The immersion system could be more tolerant of interacting with immersion liquid which had escaped from the space.

Carbon dioxide can be provided through gas supply openings 61. In an embodiment, the gas is supplied through a second array of gas supply openings or through both the gas supply openings and the second array of gas openings.

In an embodiment the flow rate of carbon dioxide out of openings 50 summed with the flow rate of gas out of extraction openings 210 is greater than or equal to the flow rate of gas out of gas supply openings 61. In an embodiment, the summed gas extraction rate is more than or equal to 1.2 or desirably more than or equal to 1.4 times the gas supply rate. For example, the gas flow rate into the openings 50 may be 60 liters per minute, the gas flow rate into extraction openings 210 may be 60 liters per minute and the gas flow rate out of gas supply openings 61 may be 90 liters per minute. This arrangement is advantageous if the gas supplied out of the gas supply openings 61 is carbon dioxide (described below). This is because carbon dioxide may interfere with an interferometer outside the fluid handling structure 12. By arranging the flow rates as described, loss of carbon dioxide out of the fluid handling structure 12 can be reduced or prevented.

In the case of using $CO_2$ in the gas knife, flow variations resulting from an inhomogeneity in the gas flow (such as that which appears when using a slit gas knife) can result in gas which is not $CO_2$ (e.g. air) from the atmosphere outside of the fluid handling structure 12 being mixed into the flow which can then reach the openings 50. This can be undesirable and so there is an advantage of using a plurality of gas supply openings 61 compared to a slit.

For the case that carbon dioxide is supplied out of the gas supply openings 61, the distance between the extraction openings 210 and the gas supply openings 61 may be at least 1 or 2 mm or within 1.0 mm to 4.0 mm, desirably within 2 mm to 3 mm. A design rule could be 4 times the working distance plus 0.2-0.5 mm. This effectively helps prevent mixing of air from outside of the fluid handling structure 12 (i.e., air radially outwardly of the extraction openings 210) into the carbon dioxide adjacent the meniscus 320.

In an embodiment, the effectiveness of extraction openings 210 in removing liquid from a facing surface, for example in the form of droplets, decreases with increased distance from a threshold distance from the gas supply openings 61. The threshold distance for droplet removal, for desired operating conditions, may be less than the desired distance between the extraction openings 210 and the gas supply openings 61. When using carbon dioxide as the gas exiting the gas supply openings 61, it may be advantageous to use grooves 220 in the undersurface of the fluid confinement structure 12 because the grooves 220 help in extending the threshold distance between the gas supply openings 61 and extraction openings 210 for droplet removal. The grooves 220 therefore assist in achieving effective carbon dioxide gas removal and droplet removal through the outer extractors.

The above embodiments have been described with reference to the presence of only one linear array of gas supply openings 61 surrounding the meniscus pinning features. However, an embodiment of the present invention is equally applicable to the case where a second (or more) plurality of gas supply openings 61 in a linear array is positioned at least partly to surround the first plurality of gas supply openings 61. The arrangement may be similar to that described in U.S. patent application publication No. US 2011-0090472 except that one or both of the two slit gas knifes are replaced with a plurality of discrete gas supply openings as described hereinabove. This may be advantageous where particularly fast relative movement between the fluid handling system 12 and the facing surface occurs. Such a larger relative velocity may be used in a lithographic apparatus for exposing substrates having a larger diameter than the current industry standard of 300 mm, for example substrates of 450 mm in diameter.

In an embodiment, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; a plurality of gas supply openings in a linear array at least partly surrounding and radially outward of the meniscus pinning feature; and at least one gas recovery opening radially outward of the plurality of gas supply openings in a linear array.

In an embodiment, the at least one gas recovery opening comprises a plurality of gas recovery openings in a linear array.

In an embodiment, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; an opening of a gas knife at least partly surrounding and radially outward of the meniscus pinning feature; and at least one gas recovery opening radially outward of the opening of the gas knife, the at least one gas recovery opening comprising a plurality of gas recovery openings of a similar or the same size.

In an embodiment, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; an opening of a gas knife at least partly surrounding and radially outward of the meniscus pinning feature; and at least one gas recovery opening radially outward of the opening of the gas knife, the at least one gas recovery opening comprising a plurality of gas recovery openings in a periodic pattern along a line.

In an embodiment, there is provided a fluid handling structure for a lithographic apparatus, the fluid handling structure having, at a boundary of a space configured to contain immersion fluid to a region external to the fluid handling structure: a meniscus pinning feature to resist passage of immersion fluid in a radially outward direction from the space; an opening of a gas knife at least partly surrounding and radially outward of the meniscus pinning feature; and at least one gas recovery opening radially outward of the opening of the gas knife, the at least one gas recovery opening comprising a plurality of gas recovery openings equidistantly spaced apart.

In an embodiment, the opening of the gas knife comprises a plurality of gas supply openings in a linear array. In an embodiment, each space between adjacent gas supply openings of the plurality of gas supply openings in a linear array has a corresponding gas recovery opening of the plurality of gas recovery openings in a linear array. In an embodiment, the corresponding gas recovery opening is positioned such that a line passing through it toward a center, in plan, of the space configured to contain immersion fluid subsequently bisects the corresponding space between adjacent gas supply openings. In an embodiment, the separation between the gas supply openings or opening of the gas knife and the gas recovery opening is at least 0.2 mm. In an embodiment, the separation between the gas supply openings or opening of the gas knife and the gas recovery opening is at most 1.0 mm. In an embodiment, the fluid handling structure further comprises a groove in an underside of the fluid handling structure extending in a direction from the gas supply openings or opening of the gas knife towards the gas recovery opening. In an embodiment, the groove has a width of at least 40 µm, or at least 50 µm. In an embodiment, the groove has a width of at most 150 µm, or at most 100 µm. In an embodiment, the groove has a depth of at least 50 µm. In an embodiment, the groove has a depth of at most 500 µm. In an embodiment, the meniscus pinning feature comprises a plurality of openings in a linear array. In an embodiment, the meniscus pinning feature comprises a single phase extractor. In an embodiment, the gas supply openings or opening of the gas knife has, in plan, a cornered shape.

In an embodiment, there is provided an immersion lithographic apparatus, the apparatus comprising: the fluid handling structure as described herein.

In an embodiment, there is provided a device manufacturing method, comprising: projecting a patterned beam of radiation through an immersion liquid confined to a space between a projection system and a substrate; providing gas through a plurality of gas supply openings in a linear array to a position adjacent a meniscus of the immersion liquid; and recovering liquid which passes through adjacent gas supply openings of the plurality of gas supply openings in a linear array through a gas recovery opening radially outward of the plurality of gas supply openings in a linear array.

In an embodiment, there is provided a device manufacturing method, comprising: projecting a patterned beam of radiation through an immersion liquid confined to a space between a projection system and a substrate; providing gas through an opening of a gas knife to a position adjacent a meniscus of the immersion liquid; and recovering liquid which passes the opening of the gas knife through at least one gas recovery opening radially outward of the opening of the gas knife, the at least one gas recovery opening comprising a plurality of gas recovery openings of a similar or the same size.

In an embodiment, there is provided a device manufacturing method, comprising: projecting a patterned beam of radiation through an immersion liquid confined to a space between a projection system and a substrate; providing gas through an opening of a gas knife to a position adjacent a meniscus of the immersion liquid; and recovering liquid which passes the opening of the gas knife through at least one gas recovery opening radially outward of the opening of the gas knife, the at least one gas recovery opening comprising a plurality of gas recovery openings in a periodic pattern along a line.

In an embodiment, there is provided a device manufacturing method, comprising: projecting a patterned beam of radiation through an immersion liquid confined to a space between a projection system and a substrate; providing gas through an opening of a gas knife to a position adjacent a meniscus of the immersion liquid; and recovering liquid which passes the opening of the gas knife through at least one gas recovery opening radially outward of the opening of the gas knife, the at least one gas recovery opening comprising a plurality of gas recovery openings equidistantly spaced apart.

As will be appreciated, any of the above described features can be used with any other feature and it is not only those combinations explicitly described which are covered in this application. For example, an embodiment of the invention could be applied to the embodiments of FIGS. 2 to 4.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In an embodiment, the lithographic apparatus may comprise an encoder system to measure the position, velocity, etc.

of a component of the apparatus. In an embodiment, the component comprises a substrate table. In an embodiment, the component comprises a measurement and/or cleaning table. The encoder system may be in addition to or an alternative to the interferometer system described herein for the tables. The encoder system comprises a sensor, transducer or read-head associated, e.g., paired, with a scale or grid. In an embodiment, the movable component (e.g., the substrate table and/or the measurement and/or cleaning table) has one or more scales or grids and a frame of the lithographic apparatus with respect to which the component moves has one or more of sensors, transducers or read-heads. The one or more of sensors, transducers or read-heads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or cleaning table) has one or more of sensors, transducers or read-heads that cooperate with the scale(s) or grid(s) to determine the position, velocity, etc. of the component.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure configured to confine immersion fluid to a space, the fluid handling structure comprising:
   a meniscus pinning feature to resist passage of immersion fluid in a radially outward direction from the space;
   a plurality of gas supply openings in a linear array at least partly surrounding and outward, relative to the space, of the meniscus pinning feature; and
   a plurality of gas recovery openings in a linear array outward, relative to the space, of the plurality of gas supply openings in a linear array, wherein each space between adjacent gas supply openings of the plurality of gas supply openings in a linear array has a corresponding gas recovery opening of the plurality of gas recovery openings in a linear array, and each space between adjacent gas recovery openings has a corresponding gas supply opening such that the corresponding gas supply opening is positioned directly radially inward of each respective space between adjacent gas recovery openings.

2. The fluid handling structure of claim 1, wherein the plurality of gas recovery openings are of a similar or the same size.

3. The fluid handling structure of claim 1, wherein the plurality of gas recovery openings are in a periodic pattern along a line.

4. The fluid handling structure of claim 1, wherein the plurality of gas recovery openings are equidistantly spaced apart.

5. The fluid handling structure of claim 1, wherein the separation between the gas supply openings and the gas recovery openings is at least 0.2 mm.

6. The fluid handling structure of claim 1, wherein the separation between the gas supply openings and the gas recovery openings is at most 1.0 mm.

7. The fluid handling structure of claim 1, further comprising a groove in an underside of the fluid handling structure extending, and being elongate, in a direction from the gas supply openings towards the gas recovery openings.

8. The fluid handling structure of claim 7, wherein the groove has a width of at least 40 μm.

9. The fluid handling structure of claim 7, wherein the groove has a width of at most 150 μm.

10. The fluid handling structure of claim 7, wherein the groove has a depth of at least 50 μm.

11. The fluid handling structure of claim 7, wherein the groove has a depth of at most 500 μm.

12. The fluid handling structure of claim 1, wherein the meniscus pinning feature comprises a plurality of openings in a linear array.

13. The fluid handling structure of claim 1, wherein the meniscus pinning feature comprises a single phase extractor.

14. The fluid handling structure claim 1, wherein the gas supply openings has, in plan, a cornered shape.

15. A lithographic apparatus, comprising:
   a substrate table configured to hold a substrate;
   a projection system configured to project a patterned beam on the substrate; and
   a fluid handling structure configured to confine immersion fluid to a space between the projection system and the substrate table, the fluid handling structure comprising:
      a meniscus pinning feature to resist passage of immersion fluid in a radially outward direction from the space,
      a plurality of gas supply openings in a linear array at least partly surrounding and outward, relative to the space, of the meniscus pinning feature, and
      a plurality of gas recovery openings in a linear array outward, relative to the space, of the plurality of gas supply openings in a linear array, wherein each space between adjacent gas supply openings of the plurality of gas supply openings in a linear array has a corresponding gas recovery opening of the plurality of gas recovery openings in a linear array, and each space between adjacent gas recovery openings has a corresponding gas supply opening such that the corresponding gas supply opening is positioned directly radially inward of each respective space between adjacent gas recovery openings.

16. The lithographic apparatus of claim 15, further comprising a groove in an underside of the fluid handling structure extending, and being elongate, in a direction from the gas supply openings towards the gas recovery openings.

17. The lithographic apparatus of claim 15, wherein the separation between the gas supply openings and the gas recovery openings is at most 1.0 mm.

18. The lithographic apparatus of claim 15, wherein the meniscus pinning feature comprises a plurality of openings in an array.

19. A device manufacturing method, comprising:
projecting a patterned beam of radiation through an immersion liquid confined to a space between a projection system and a substrate;
providing gas through a plurality of gas supply openings in a linear array to a position adjacent a meniscus of the immersion liquid; and
recovering liquid which passes through adjacent gas supply openings of the plurality of gas supply openings in a linear array through a plurality of gas recovery openings in a linear array radially outward of the plurality of gas supply openings in a linear array, wherein each space between adjacent gas supply openings of the plurality of gas supply openings in a linear array has a corresponding gas recovery opening of the plurality of gas recovery openings in a linear array, and each space between adjacent gas recovery openings has a corresponding gas supply opening such that the corresponding gas supply opening is positioned directly radially inward of each respective space between adjacent gas recovery openings.

20. The method of claim 19, wherein the plurality of gas recovery openings are of a similar or the same size and arranged in a periodic pattern along a line.

\* \* \* \* \*